(12) United States Patent
Braun et al.

(10) Patent No.: US 7,457,174 B2
(45) Date of Patent: Nov. 25, 2008

(54) SEMICONDUCTOR MEMORY AND METHOD FOR ADAPTING THE PHASE RELATIONSHIP BETWEEN A CLOCK SIGNAL AND STROBE SIGNAL DURING THE ACCEPTANCE OF WRITE DATA TO BE TRANSMITTED

(75) Inventors: Georg Braun, Holzkirchen (DE); Eckehard Plaettner, Oberhaching (DE); Christian Weis, Munich (DE); Andreas Jakobs, Munich (DE)

(73) Assignee: Infineon Technologies AG, Munich (DE)

( * ) Notice: Subject to any disclaimer, the term of this patent is extended or adjusted under 35 U.S.C. 154(b) by 283 days.

(21) Appl. No.: 11/410,320

(22) Filed: Apr. 24, 2006

(65) Prior Publication Data
US 2006/0262613 A1 Nov. 23, 2006

(30) Foreign Application Priority Data
Apr. 23, 2005 (DE) .................. 10 2005 019 041

(51) Int. Cl.
*G11C 7/00* (2006.01)
(52) U.S. Cl. ............... 365/193; 365/233.1; 365/233.16; 365/233.5
(58) Field of Classification Search ........ 365/193, 365/194, 233.1, 233.16, 233.5, 189.07, 233.12
See application file for complete search history.

(56) References Cited
U.S. PATENT DOCUMENTS
6,317,369 B1 * 11/2001 Kubo et al. ............. 365/193
6,498,766 B2 * 12/2002 Lee et al. ............. 365/189.15
6,570,944 B2 * 5/2003 Best et al. .................. 375/355
6,728,144 B2 * 4/2004 Nygren ..................... 365/193
6,807,613 B1 * 10/2004 Keeth et al. ................ 711/167
6,917,561 B2 * 7/2005 Moss et al. ............. 365/189.16
7,016,237 B2 * 3/2006 Lee et al. ............. 365/189.05
7,126,874 B2 * 10/2006 Lin et al. ............... 365/189.19
2004/0143775 A1 7/2004 Li et al.

OTHER PUBLICATIONS

JEDEC Standard, DDR2 SDRAM Specification, JESD79-2B (Revisison of JESD79-2A), Jan. 2005, JEDEC Solid State Technology Association.
DDR2 SDRAM Specification, JEDEC Standard No. 79-2A, pp. 6 and 14-22, Jan. 2004.

* cited by examiner

*Primary Examiner*—VanThu Nguyen
*Assistant Examiner*—Alexander Sofocleous
(74) *Attorney, Agent, or Firm*—Patterson & Sheridan, L.L.P.

(57) ABSTRACT

A method is provided for adapting the phase relationship between a clock signal and a strobe signal for accepting write data to be transmitted into a memory circuit, a write command signal being transmitted to the memory circuit in a manner synchronized with the clock signal, a write data signal being transmitted synchronously with the strobe signal, a phase offset between the transmitted clock signal and the transmitted strobe signal being set such that the write data are reliably accepted in the memory circuit. The method comprises the following acts performed in the memory circuit: generating a write acceptance signal depending on the clock signal and the write command signal with a specific pulse duration; determining the number of edges of the strobe signal with a defined edge direction during the pulse duration; comparing the number determined with a predetermined desired number of corresponding edges of the strobe signal; and providing an item of error information indicating whether the number determined matches the desired number.

24 Claims, 8 Drawing Sheets

SEMICONDUCTOR MEMORY AND METHOD FOR ADAPTING THE PHASE RELATIONSHIP BETWEEN A CLOCK SIGNAL AND STROBE SIGNAL DURING THE ACCEPTANCE OF WRITE DATA TO BE TRANSMITTED

CROSS-REFERENCE TO RELATED APPLICATIONS

This application claims foreign priority benefits under 35 U.S.C. §119 to co-pending German patent application number DE 10 2005 019 041.3-55, filed 23 Apr. 2005. This related patent application is herein incorporated by reference in its entirety.

BACKGROUND OF THE INVENTION

1. Field of the Invention

The present invention relates to a method for adapting the phase relationship between a clock signal provided by a memory control unit (memory controller) and a strobe signal provided by the memory control unit during the acceptance of transmitted write data in a memory circuit. The invention furthermore relates to a memory circuit with which the phase relationship between the clock signal and the strobe signal can be adapted. The invention furthermore relates to a memory control unit which adapts the phase relationship between the clock signal and the strobe signal.

2. Description of the Related Art

Conventional memory circuits are usually driven with the aid of a memory control unit (a so-called memory controller) in order to operate the memory circuits in a specification-conforming manner. For the communication of the memory control unit with one or more memory circuits, in particular dynamic random access memory circuits or DRAM memory circuits, use is generally made of a clock signal for the transmission of the command and address data and also a strobe signal for the transmission of the write data which are to be stored in the memory circuit. When the clock signal and the strobe signal arrive in the memory circuit, the strobe signal and the clock signal must comply with a fixedly predefined phase relationship, which is essentially described by a setup time tDSS and a hold time tDSH for the strobe signal relative to the clock signal, in order to ensure that data to be written are accepted correctly into the memory circuit.

Compliance with said phase relationship is usually achieved through careful adaptation of the interconnect lengths between the memory control unit and the respective memory circuit for the clock signal and the strobe signal and also for the corresponding command and address signals and the data signals. It must be taken into account in this case, however, that the respective signals, under certain circumstances, have different propagation speeds on their respective signal lines, e.g. on account of different loads of the inputs connected thereto, and also by virtue of their different physical properties.

In the case of certain bus arrangements between the memory control unit and the memory circuits of a memory module, equalization of the propagation times is possible only in a very limited frequency band or is no longer possible at all under certain circumstances. Particularly when using a fly-by bus for the transmission of the clock signal and of the command and address data transmitted in a manner synchronized therewith, a non-defined phase offset occurs between the clock signal and strobe signal. The corresponding signal propagation times when using the fly-by bus are usually longer than in the case of the lines for the transmission of the strobe signal and the data signals transmitted in a manner synchronized therewith, which are usually embodied in the form of a point-to-point (P2P) connection between the memory control unit and the memory circuit.

In this regard, the memory control unit usually has a circuit which generates the clock signal and the strobe signal for the memory circuits, it being possible for the temporal relationship of the two signals to be set within certain limits. Such a circuit can be used to set the phase relationship of the two signals upon arrival at the corresponding memory circuit, independently of the relative length of the lines for the clock signal and the strobe signal and the loads present on them.

In order to be able to set the phase relationship of the memory control unit in such a way that the signals arrive at the memory circuit with the desired phase offset or correctly in terms of phase, the memory circuit may be provided with a phase comparator that measures the temporal relationship between the clock signal and the strobe signal. The measured result is transmitted to the memory control unit, which can thereupon correspondingly correct the delay time chosen between the clock signal and the strobe signal. Since the temporal relationship between the clock signal and the strobe signal can only be measured relatively inaccurately with a tenable outlay on circuitry, in particular also owing to the production technology used in the case of memory circuits, it is necessary to take account of large tolerances in the setting of the phase relationship in the memory control unit, so that the maximum operating frequency of the memory circuit is limited.

A further possible disadvantage is that the phase comparator merely determines the phase information between clock signal and strobe signal, but without simulating the actual failure mechanism of the memory circuit in the case of a non-indication-conforming phase relationship between the clock signal and the strobe signal. That is to say that while the clock signal and the strobe signal have hitherto been applied by the memory control unit in such a way that they are present at the respective memory circuit with a defined phase relationship which lies within the values predefined by the indication, provision has not been made hitherto for operating memory circuits outside the limit values predefined by the indication, even if they can be operated without errors beyond the specification-conforming limits.

SUMMARY OF THE INVENTION

A first aspect of the present invention provides a method for adapting the phase relationship between a clock signal provided by a memory control unit and a strobe signal provided by the memory control unit for accepting write data to be transmitted into a memory circuit. In this case, a write command signal is transmitted to the memory circuit in a manner synchronized with the clock signal, and a write data signal is transmitted synchronously with the strobe signal. Between the transmitted clock signal and the transmitted strobe signal a phase offset is set in such a way that the write data are reliably accepted in the memory circuit. The following acts are performed in the memory circuit:

- generating a write acceptance signal depending on the clock signal and the write command signal with a specific pulse duration;
- determining the number of edges of the strobe signal with a defined edge direction (slope) during the pulse duration; and
- providing an item of error information depending on the number determined.

Moreover, the number determined is compared with a predetermined desired number of corresponding edges of the strobe signal, and an item of information that specifies whether the number determined matches the desired number being provided as error information.

The method according to one embodiment of the invention uses a write acceptance signal, which predefines a specific pulse duration within which all write data have to be received for a correct acceptance into the memory circuit, in order to ascertain whether the clock signal and the strobe signal have a phase offset such that it enables the memory circuit to be reliably operated. The write acceptance signal is a signal which is generated in conventional memory circuits, and usually serves as an activation signal for a counter which counts defined edges of a strobe signal and, after reaching a desired number of the defined edges, reads out the write data expected in the meantime from an input latch, e.g. with the aid of a flip-flop or a write register, and applies them to an internal data bus. In the case of the present invention, the write acceptance signal is used to ascertain whether the number of defined edges of the strobe signal corresponds to the desired number of defined edges, so that, if this is the case, it can be assumed that the write data were able to be completely received during the pulse duration of the write acceptance signal since the write data are transmitted essentially synchronously with the strobe signal. With the aid of an item of error information indicating whether or not the determined number of defined edges matches the desired number of defined edges, it is thus possible to ascertain whether or not the phase offset between the transmitted clock signal and the transmitted strobe signal is such that the memory circuit can be operated without errors and reliably. If it is ascertained that the number of defined edges deviates from the desired number of defined edges, then there exists between the transmitted clock signal and the transmitted strobe signal a phase offset which does not permit the reliable acceptance of the write data into the memory circuit. By virtue of the provision of the error information, it is then possible, for example, to signal to the memory control unit to change the phase offset between the clock signal and the strobe signal.

It may furthermore be provided that the memory control unit sets the phase offset depending on the error information. Furthermore, it may be provided that the memory control unit sets a calibration mode in the memory circuit, wherein, in the calibration operating mode, the phase offset to be set being determined iteratively by multiple writing of test data.

In the calibration mode, the phase offset between the clock signal and the strobe signal may be varied in a phase offset range, and the corresponding resulting items of error information are received, so that it is possible to determine from the resulting corresponding items of error information an upper limit value and a lower limit value of the phase offsets between which the memory circuit can reliably accept the write data, the phase offset being set in such a way that it lies between the upper limit value and the lower limit value.

Furthermore, the error information is derived from an accept signal indicating that all the write data to be received have been received, and the error information indicates an error if an accept signal is not present after the pulse duration has elapsed.

A further aspect of the present invention provides a memory circuit for generating an item of error information for the adaptation of the phase relationship between an applied clock signal and an applied strobe signal. The memory circuit comprises a command data reception unit for receiving a command signal and a clock signal, a write data reception unit for receiving a write data signal and a strobe signal, and also a test unit. The test unit has an edge counter, which determines the number of edges of the strobe signal with a defined edge direction during a pulse duration of a write acceptance signal dependent on the clock signal and the write command signal. A provision unit is provided in order to provide an item of error information depending on the number determined.

Moreover, a comparator is provided which compares the number determined with a predetermined desired number of corresponding edges of the strobe signal, the provision unit providing as error information an indication indicating whether the number determined matches the desired number.

As an alternative, the provision unit may also provide the number determined as error information.

The memory circuit according to the invention makes it possible, e.g., to inform a memory control unit, with the aid of the error information provided, as to whether or not the phase relationship between the clock signal and the strobe signal is suitable for reliably accepting the write data into the memory circuit. This information may be used in a calibration mode, for example, either to maintain the phase offset between clock signal and strobe signal or, if write data cannot be reliably accepted into the memory circuit, to change the phase offset. In calibration mode, the memory circuit according to embodiments of the invention can therefore be used to adapt the phase offset between clock signal and strobe signal in such a way that write data can be reliably accepted into the memory circuit. For this purpose, it is necessary to quantify the phase offset between clock signal and strobe signal in the memory circuit and to communicate the corresponding value for the phase offset externally. This is advantageous in particular since a phase comparator used in the prior art is complex to realize and has a very great inaccuracy, which leads to problems in the adaptation of the phase offset particularly at high operating frequencies.

A buffer storage device may be provided for buffer-storing the error information to be output.

In accordance with a further embodiment of the invention, the edge counter may generate an accept signal for accepting the received write data onto an internal data bus. The buffer storage device may be formed as an RS flip-flop, the RS flip-flop being connected to the edge counter in order to set the RS flip-flop if the accept signal indicates the complete reception of all the write data to be received, and in order to reset the RS flip-flop at the beginning of the pulse duration of the write acceptance signal.

A further aspect of the present invention provides a memory control unit. The memory control unit has a command data transmission unit, which transmits a clock signal and a command signal synchronized with the clock signal. Furthermore, a write data transmission unit is provided, which transmits a strobe signal and a write data signal synchronized with the strobe signal. With the aid of an error data reception unit, it is possible to receive an item of error information indicating whether or not all the write data were accepted during the last write access. As an alternative, a number of received edges of the strobe signal may be received as error information. With the aid of a phase circuit, a phase offset between the clock signal and the strobe signal is set depending on the received error information.

The memory control unit makes it possible to correspondingly set the phase offset between the clock signal and the strobe signal merely on the basis of an item of error information indicating whether or not all the write data were accepted during the last write access.

Furthermore, the memory control unit has a control device for setting a calibration mode in a memory circuit that can be connected. The control device may be provided in such a way that a plurality of write operations with different phase offsets are carried out with the aid of the command data transmission unit and the write data transmission unit, the error data reception unit receiving the corresponding items of error information, the control device being provided such that, depending on the items of error information and the correspondingly assigned phase offsets, a phase offset is selected and set in the case of which the associated item of error information specifies that the write data were able to be accepted into the memory circuit.

Furthermore, the error data reception unit receives the resulting corresponding items of error information. The control device determines an upper limit value and a lower limit value of the phase offsets between which the semiconductor memory can reliably accept the write data, the phase circuit setting the phase offset in such a way that it lies between the upper limit value and the lower limit value. In this way, it is possible to carry out an iterative method for determination of a phase offset range within which the write data can be reliably accepted into the memory circuit. The memory control unit is usually integrated in a production technology which enables a more accurate setting of the phase offset between the clock signal and the strobe signal than would be possible in the case of a customary production technology for memory circuits. Therefore, the phase offset range, within which the memory circuit can be operated, can be determined more accurately in the memory control unit than would be the case with the conventional methods in which the phase offset between the clock signal and strobe signal arriving in the memory circuit is measured in the memory circuit and the measurement result is communicated to the memory control unit.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
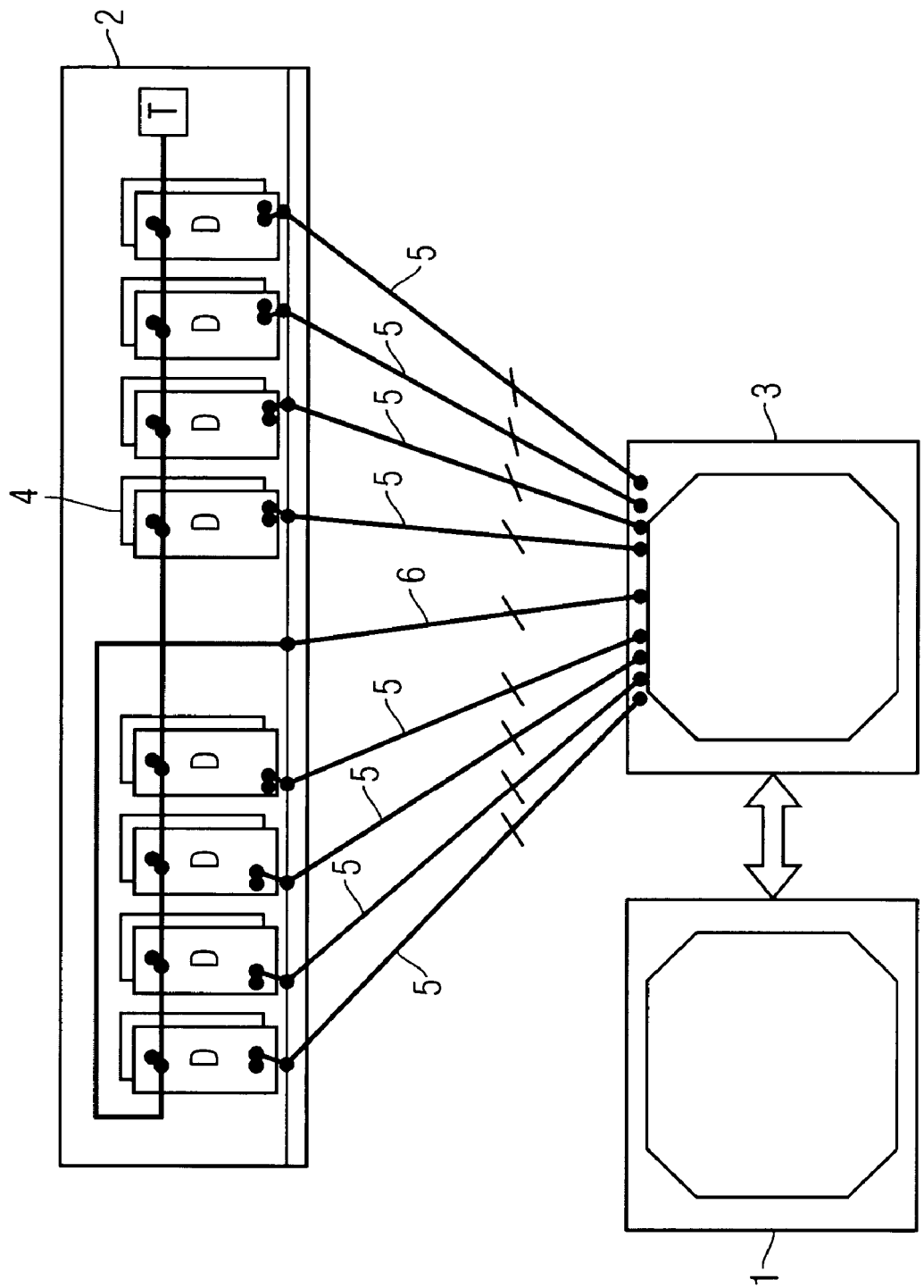
FIG. 1 shows a data processing system with a memory control unit and a memory module with a plurality of memory circuits.

FIG. 1 shows a data processing system having a data processing unit 1, which processes data from a memory module 2. The data processing unit 1 is connected to the memory module 2 in a suitable manner via a memory control unit 3, which undertakes the driving of the memory module 2. The memory module 2 has individual memory circuits 4 which can be driven by the memory control unit 3.

The memory circuits 4 are in each case connected via a corresponding number of data signal lines 5 to corresponding terminals of the memory control unit 3, the corresponding number being predefined by the parallelism of the data signals for each memory circuit 4. The data signals are transmitted from and to the memory circuits 4 via the data signal lines 5. The data signal lines 5 likewise comprise a strobe signal line, via which a strobe signal is transmitted from the memory control unit 3 to the memory circuits 4, the strobe signal being synchronized with the write data which are to be written to the memory circuits 4. As an alternative, the strobe signal may also be transmitted differentially via two strobe signal lines.

Furthermore, the memory control unit 3 makes command and address data available on a plurality of command and address lines 6, which can transmit the memory address to be addressed in the memory circuits 4 and a memory command to the memory circuits. The command and address lines 6 are connected to all of the corresponding command and address inputs (not shown) of the memory circuits 4 and are led past the command and address inputs in the form of a so-called fly-by bus and are correspondingly electrically terminated after making contact with the command and address inputs of the last memory circuit. The command and address signals applied on the command and address lines thus propagate through the command and address lines 6 and in this way pass successively to the corresponding command and address inputs of the memory circuits 4. The command and address lines likewise comprise one or more clock signal lines via which a clock signal is transmitted, the command and address signals being synchronized with said clock signal. The clock signal may be transmitted either on one clock signal line or differentially via a plurality of clock signal lines.

On account of the different line lengths between command and address lines 6 and the data signal lines 5 and also on account of the different electrical loads on account of the respective number of connected inputs of the memory circuits, different signal propagation times occur on the data signal lines 5 and on the command and address lines 6. This has the effect that the command and address data and the clock signal and also the write data signals and the strobe signal, given simultaneous application of these signals by the memory control unit 3, would be present in phase-offset fashion at the memory components 4.

Figure 2:
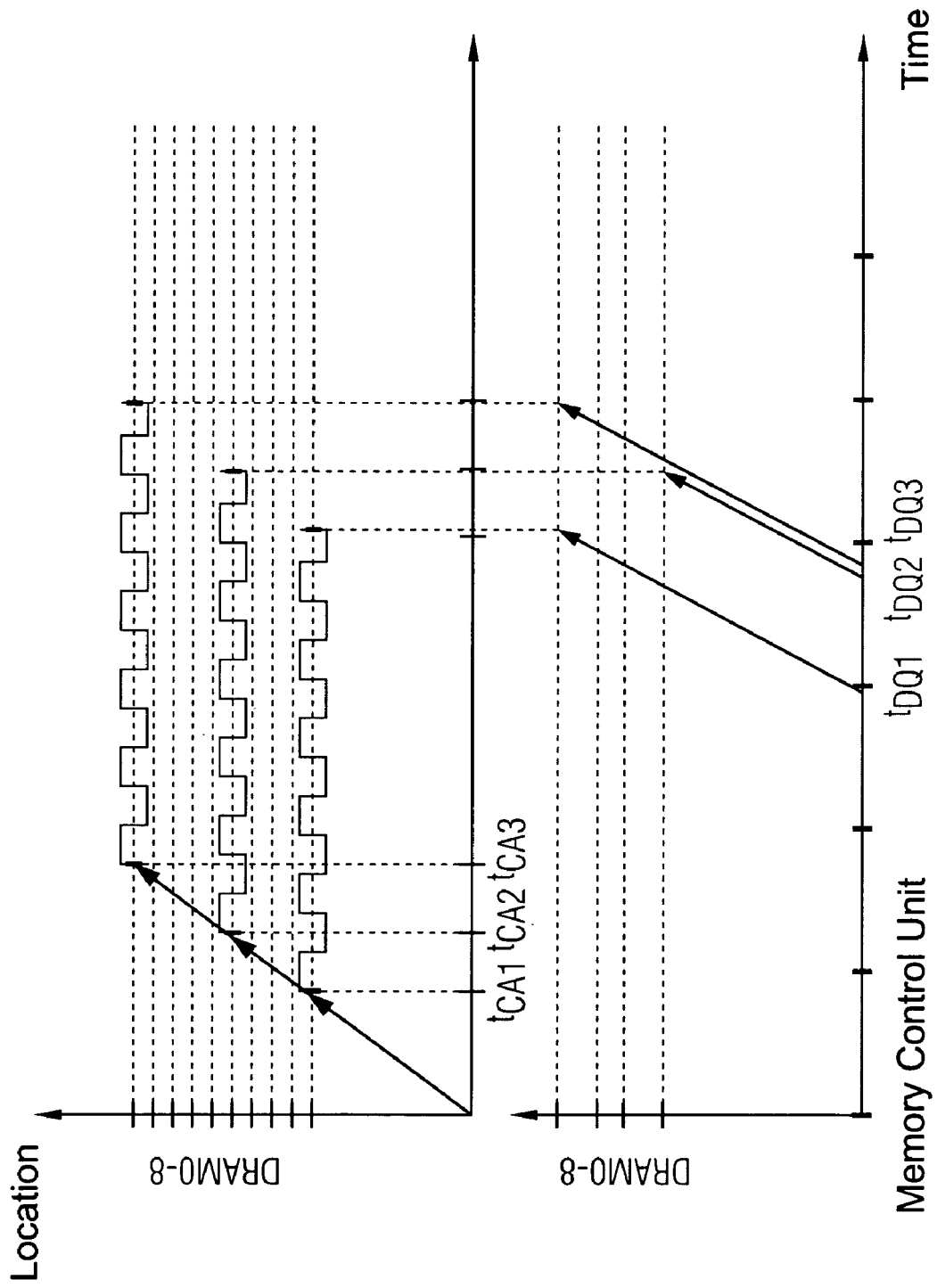
FIG. 2 shows a signal timing diagram illustrating the offset between the transmission of a command signal and the transmission of the write data.

This is illustrated for example by FIG. 2, which illustrates the signal propagation time of a command and address signal transmitted by the memory control unit and its respective reception times $t_{CA1}$, $t_{CA2}$, $t_{CA3}$ at the corresponding memory circuits 4. When writing to the memory circuits, the transmission of the write data must begin in a predefined time window, so that the write data are present at the relevant memory component within a specific time window after a write latency WL (after six clock periods in the present example). Therefore, the memory data have to be transmitted with a corresponding delay by the memory control unit 3, so that the write data are present at the memory circuit 4 at the beginning of the specific time window after the corresponding signal propagation time on the data signal lines 5 and are accepted completely into the corresponding memory component during the time duration of the time window. The beginning of the application of the write data to the individual memory circuits 4 by the memory control unit 3 is correspondingly designated by the instants $t_{DQ1}$, $t_{DQ2}$ and $t_{DQ3}$. In this case, in addition to the propagation times of the command and address signals to the individual memory circuits, it is also necessary to take account of the propagation times of the data signals on the data signal lines, which may be different for each of the memory circuits.

Figure 3:
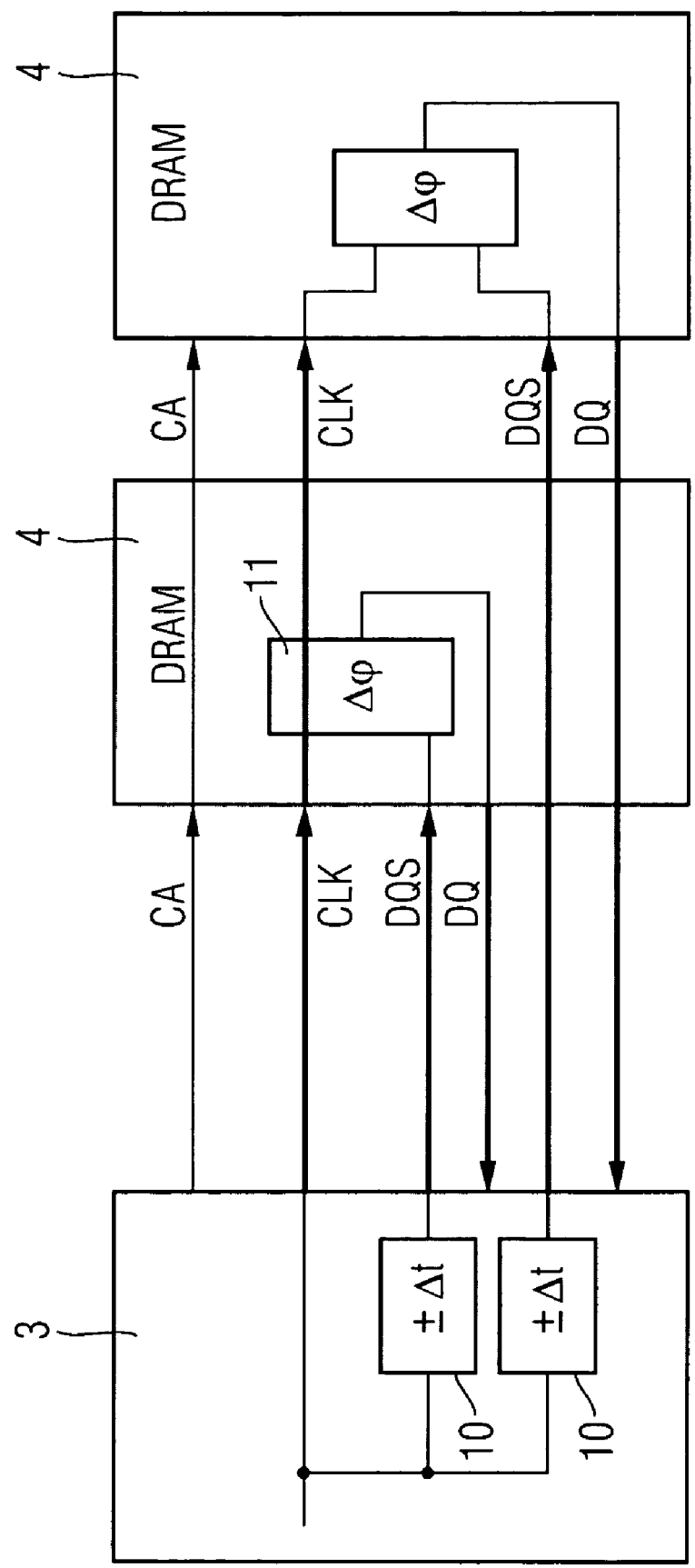
FIG. 3 shows a memory system with a memory control unit and two memory circuits in accordance with the prior art.

In a conventional memory system such as is illustrated in FIG. 3, the memory control unit 3 may have delay elements 10 which are assigned to each of the memory circuits and which delay the data signals and also the associated strobe signal by a predetermined phase offset in order to bring it into a predetermined phase relationship with respect to the command and address signals and also the clock signal. What is thereby achieved is that the command and address signals and the clock signal and also the strobe signal and the data signals are present at the respective memory circuits 4 in a desired temporal relation. For this purpose, each memory circuit 4 has a phase comparator 11, which compares the clock signal CLK and the strobe signal DQS with one another, which are present at its corresponding inputs, and determines the phase offset. Said phase offset is quantified and communicated back via the corresponding data signal lines to the memory control unit 3, which correspondingly delays or accelerates the corresponding strobe signal DQS, so that it is present at the relevant memory circuit 4 in a correct phase relationship. This is carried out in each of the memory circuits 4, so that the delay element 10 assigned to the respective memory circuit 4 can set the corresponding delay or acceleration of the strobe signal DQS.

Such a memory system has the disadvantage that phase comparators can be implemented only very inaccurately and with a considerable outlay in a production technology used for DRAM memory components, so that, on the one hand, the area requirement in the memory circuit is increased and, on the other hand, only a very inaccurate phase adaptation between the strobe signal DQS and clock signal CLK is possible.

Figure 4:
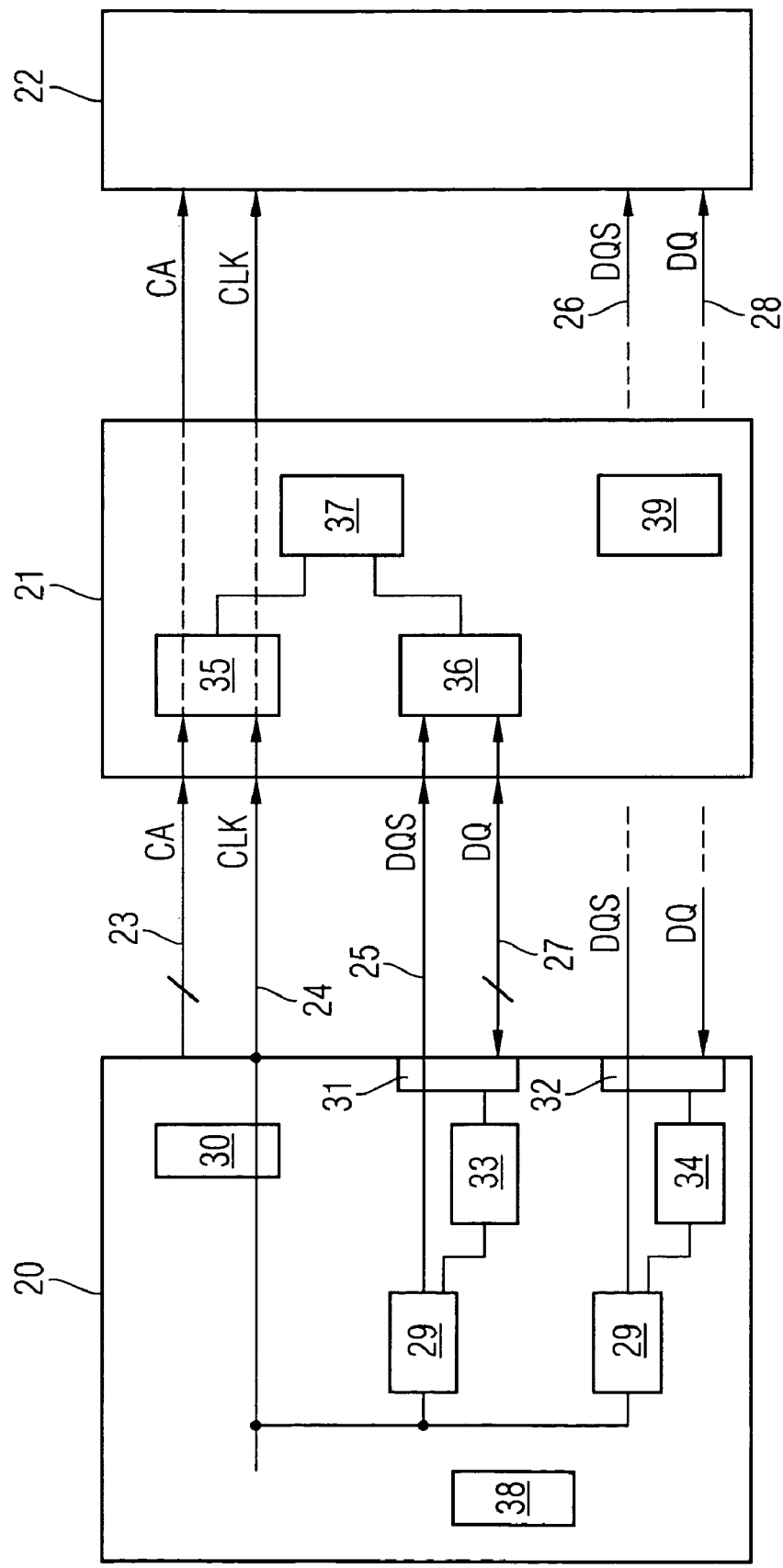
FIG. 4 shows a memory system with a memory control unit and two memory circuits in accordance with one embodiment of the invention.

FIG. 4 illustrates a memory system in accordance with a preferred embodiment of the present invention as a block diagram. The memory system comprises a memory control unit 20, which is connected to a first memory circuit and a second memory circuit 22 of a memory module. As already described in connection with the prior art, the memory control unit 20 outputs command and address signals on a corresponding number of command and address signal lines 23, which signals are applied via the command and address signal lines 23 to the first memory circuit 21 and then via the same command and address signal lines 23 to the second memory circuit 22.

The memory control unit 20 likewise outputs a clock signal CLK, which is applied via a clock signal line 24 to the first memory circuit 21 and then via the same clock signal line 24 to the second memory circuit 22.

The first and second memory circuits 21, 22 are respectively connected to the memory control unit 20 via separate strobe signal lines 25, 26 and separate data signal lines 27, 28. The memory control unit has delay elements 29 for generating the data signals and the strobe signal DQS. The strobe signal DQS is generated from the clock signal CLK made available in the memory control unit.

For driving the command and address signals CA and also the clock signal CLK, a command data transmission unit 30 is provided in the memory control unit 20, the clock signal CLK and the address and command signals CA being synchronized with one another and being driven onto the corresponding signal lines 23, 24. Furthermore, a first write data transmission unit 31 and second write data transmission unit 32 are provided, which respectively transmit the strobe signal and the write data signals, which are synchronized with one another, to the first and second memory circuits 21, 22.

Furthermore, a first error data reception unit 33 and a second error data reception unit 34 are provided for receiving an item of error information from the first and second memory circuit 21, 22, respectively. The error information from the respective memory circuits 21, 22 specifies whether or not the write data were able to be completely received during the last write access (burst access).

In another embodiment, the error information may also contain the indication of the received write data, it being ascertained in the memory control unit 20 whether the number corresponds to the desired number and the indication as to whether or not the write data were completely received being derived from this.

The error data reception units 33, 34 are connected to the respective delay circuit 29 in order to adapt the phase offset between the clock signal CLK and the strobe signal DQS of the respective memory circuit 21, 22 depending on the error information obtained.

The functions implemented in the respective memory circuit 21, 22 are explained with reference to the first memory circuit 21. Each of the memory circuits 21, 22 has a command data reception unit 35 for receiving the command and address signals CA via the command and address signal lines 23 and the clock signal CLK via the clock signal line 24. Furthermore, each of the memory circuits 21, 22 has a write data reception unit 36 for receiving write data signals via the data signal lines 27, 28, respectively, and the strobe signal DQS via the strobe signal line 25, 26, respectively.

Both the command data reception unit 35 and the write data reception unit 36 are connected to a test unit 37, which generates an item of error information indicating whether the write data transmitted via the data signal lines 27 were able to be reliably accepted. This is problematic in particular since there are different propagation times of the clock signal CLK on the clock signal line and of the strobe signal DQS on the strobe signal line 25, so that it is initially not ensured that the command and address signals CA and the data signals are in a predetermined temporal relation with respect to one another.

Ultimately, a check is made in the test unit 37 to determine whether a specific number of defined clock edges of a specific edge direction of the strobe signal DQS arrive in the write data reception unit 36 within a time window, which is defined by a write acceptance signal. In order that the corresponding write data are accepted into the respective memory circuit 21, 22 by means of the defined edges, and since the strobe signal is synchronized with the transmitted write data, it is possible, upon reception of the desired number of defined edges of the strobe signal, to conclude that all the transmitted data were reliably accepted into the memory circuit.

In the exemplary embodiment shown, the error information thus indicates whether the writing of data to the corresponding memory circuit 21, 22 was successful or not. The error information is transmitted back via one of the data signal lines 27, 28 to the corresponding error data reception unit 33, 34 of the memory control unit 20 and is used there for setting the delay unit 29.

The adaptation of the delay unit 29 may be effected in a calibration mode that is communicated to the memory circuit by the memory control unit 20 in a suitable manner. In the calibration mode, different delays are set in the delay unit 29 successively by means of a test control unit 38 provided in the memory control unit, in order to achieve different phase offsets between clock signal CLK and strobe signal DQS. For each time offset set, it is ascertained in a subsequent write operation whether or not the write data were able to be written properly to the memory circuit. The corresponding error information may be stored in a test control unit 38 together with the delay set between clock signal and strobe signal. From the data thus determined, it is possible to determine a phase offset window which determines an upper limit and a lower limit of the phase offset (of the delays set) between which data can be written correctly to the memory circuit and outside of which data cannot be written reliably to the memory circuit. This iterative method of determining the optimum delay in the delay element 29 has the advantage that the delay in the delay element 29 does not have to be oriented to the specification-conforming parameters of the memory circuit, but rather is geared to the actual parameters of the memory circuit used. Consequently, there is also no need for the memory control unit 20 to ensure that it operates the connected memory circuit 21 in a specification-conforming manner in this regard.

Figure 5:
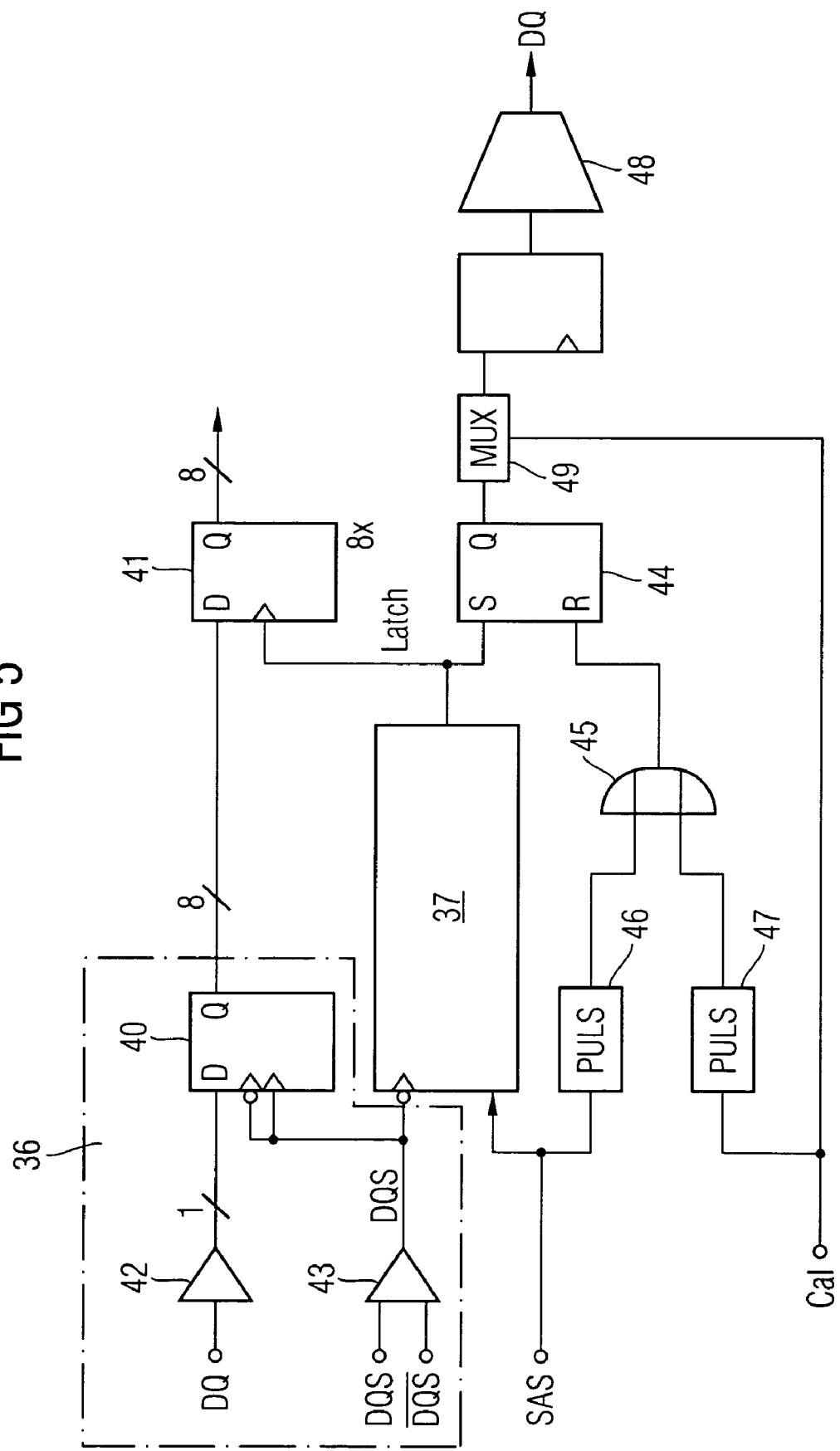
FIG. 5 shows a block diagram of a detail from a memory circuit according to one embodiment of the present invention.

FIG. 5 illustrates a block diagram as a detail from the memory circuit comprising the write data reception unit and the test unit and also the buffer storage device 39 for storing the error information.

The write data reception unit 36 comprises a shift register 40 for each data signal line, the shift register accepting and storing the data signal respectively present on the data signal line both in the case of a rising edge and in the case of a falling edge. After a specific number of rising and falling edges of the strobe signal DQS, e.g. eight, the shift register 40 is full, and on the corresponding eight internal data lines the accepted data are applied to an octal D-type flip-flop 41. For receiving the data signals via the data signal line 27, the memory circuit has a data signal input driver 42. A differential input amplifier 43 is provided for accepting the strobe signal, which is transmitted differentially in this exemplary embodiment. The differential input amplifier 43 outputs the strobe signal DQS at an output, said strobe signal being applied to the shift register 40.

The strobe signal DQS is furthermore applied to the test unit 37. The test unit 37 has a further input for a write acceptance signal SAS made available by the command data reception unit. The write acceptance signal SAS is generated in the write data reception unit after the reception of a write command, that is to say of a command that predefines the writing of data to the memory circuit, after a defined write latency WL has elapsed, as a pulse having a specific pulse duration during which the write data of the expected data burst must have been completely applied at the inputs of the memory circuit. In the present example, the length of the pulse duration amounts to approximately four periods of the clock or strobe signal CLK, DQS, within which four falling edges of the strobe signal must arrive. The test unit 37 is configured, then, in such a way that, during the pulse duration of the write acceptance signal, it counts the number of edges of the strobe signal with a specific edge direction and compares it with a predefined desired number. The desired number is set either by a corresponding register (not shown) or in a fixedly predefined manner.

If the desired number of corresponding edges of the strobe signal is reached, a latch signal LATCH is generated, which on the one hand is applied to an accept input of the octal D-type flip-flop 41 and on the other hand is applied to a set input of an SR flip-flop 44. The SR flip-flop 44 constitutes a buffer storage device which stores the error information with regard to the error-free or erroneous progression of the write operation. If the SR flip-flop 44 is set at the end of the pulse duration of the write acceptance signal SAS, the write operation has been successfully concluded. If the SR flip-flop 44 is not set, then the write operation has not proceeded successfully since the phase offset of the strobe signal DQS and of the write acceptance signal SAS formed from the clock signal CLK has not made it possible to receive the necessary number of edges with the defined edge direction. Prior to each write operation, that is to say before a data burst is in each case received by the memory control unit, the SR flip-flop 44 is reset by a corresponding reset pulse being applied to a reset input of the SR flip-flop 44. The reset pulse is generated on the one hand by the initial edge of the pulse of the write acceptance signal SAS and also at the beginning of a calibration operating mode, which is indicated by a calibration signal CAL. Both the write acceptance signal SAS and the calibration signal CAL are in each case fed to a pulse generator 46, 47, which in each case generate a high pulse upon a rising edge of the corresponding signal for example, which high pulses are in each case fed to an OR gate 45, which ORs the two pulse signals with one another and applies the result to the reset input of the SR flip-flop 44. Consequently, the SR flip-flop 44 is reset both with the initial edge of the write acceptance signal and also at the beginning of the calibration operating mode. With the aid of the calibration signal CAL, the SR flip-flop 44 is applied to one or a plurality of data outputs 48 of the memory circuit via one or a plurality of data signal lines or one or a plurality of separate lines, so that the error information stored in the SR flip-flop 44 can be read out externally in a synchronous or asynchronous manner.

Figure 6:
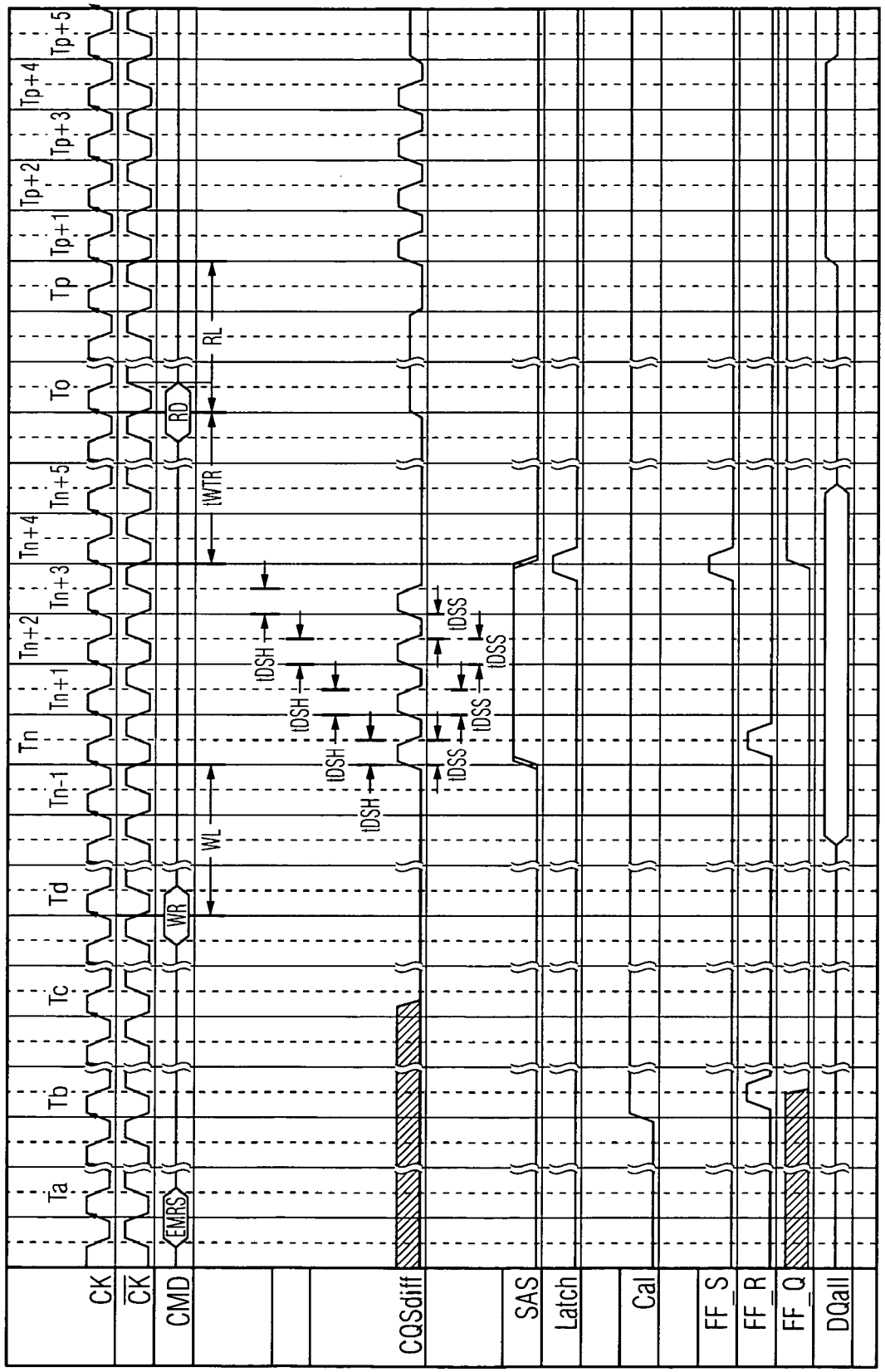
FIG. 6 shows a signal timing diagram in the case of an optimum phase relationship between the clock signal and the strobe signal.

FIG. 6 illustrates a signal timing diagram illustrating the profile of the input signals and of the internal signals of the memory circuit. The illustration shows the internal clock signal, which is transmitted as the differential signals CK and/CK and is processed further internally to form the clock signal CLK. The command and address signals CMD are transmitted synchronously with the clock signal CLK. Furthermore, the strobe signal DQS, the write acceptance signal SAS and the latch signal LATCH and the calibration signal CAL and also the input signals FF_S, FF_R and the output signal FF_Q of the SR flip-flop 44 are illustrated. It is evident that after the arrival of a write command WR (signal CMD) and the acceptance thereof into the command data reception unit with a rising clock edge of the clock signal CLK (CK), waiting takes place during the duration of a write latency WL, which amounts to six periods of the clock signal in the present example, before a pulse of the write acceptance signal SAS is generated, which lasts for four clock periods. This pulse represents the time window in which write data can be received at the inputs of the memory circuit. Within the pulse duration of the write acceptance signal SAS, it is necessary, then, as shown in the signal timing diagram of FIG. 6, for four falling edges of the strobe signal to arrive at the memory circuit in order that the write data transmitted synchronously therewith are accepted into the memory circuit. The falling edge of the strobe signal DQS has to comply with a minimum time duration tDSS as setup time with regard to the subsequent rising edge of the clock signal CLK and a time duration tDSH as hold time with respect to the preceding rising edge of the clock signal, so that the write data can be reliably accepted.

During the pulse duration of the write acceptance signal, the falling edges of the strobe signal are then counted and compared with a desired number, in this case four. If the desired number is reached, a latch signal pulse is generated, with the aid of which, on the one hand, the data applied at the output of the shift register 40 are accepted into the octal D-type flip-flop 41 and, on the other hand, the SR flip-flop 44 is set in order to store an item of error information indicating that the data were able to be properly accepted. During the subsequent write command, with the aid of the initial edge of the write acceptance signal SAS a further pulse signal is generated, which is applied to the reset input of the SR flip-flop 44 in order to reset the latter. It can likewise be gathered from the signal timing diagram of FIG. 6 that with the initial edge of the calibration signal CAL, a reset signal FF_R is generated, which is applied to the R input of the SR flip-flop 44 in order to reset the latter.

Figure 7:
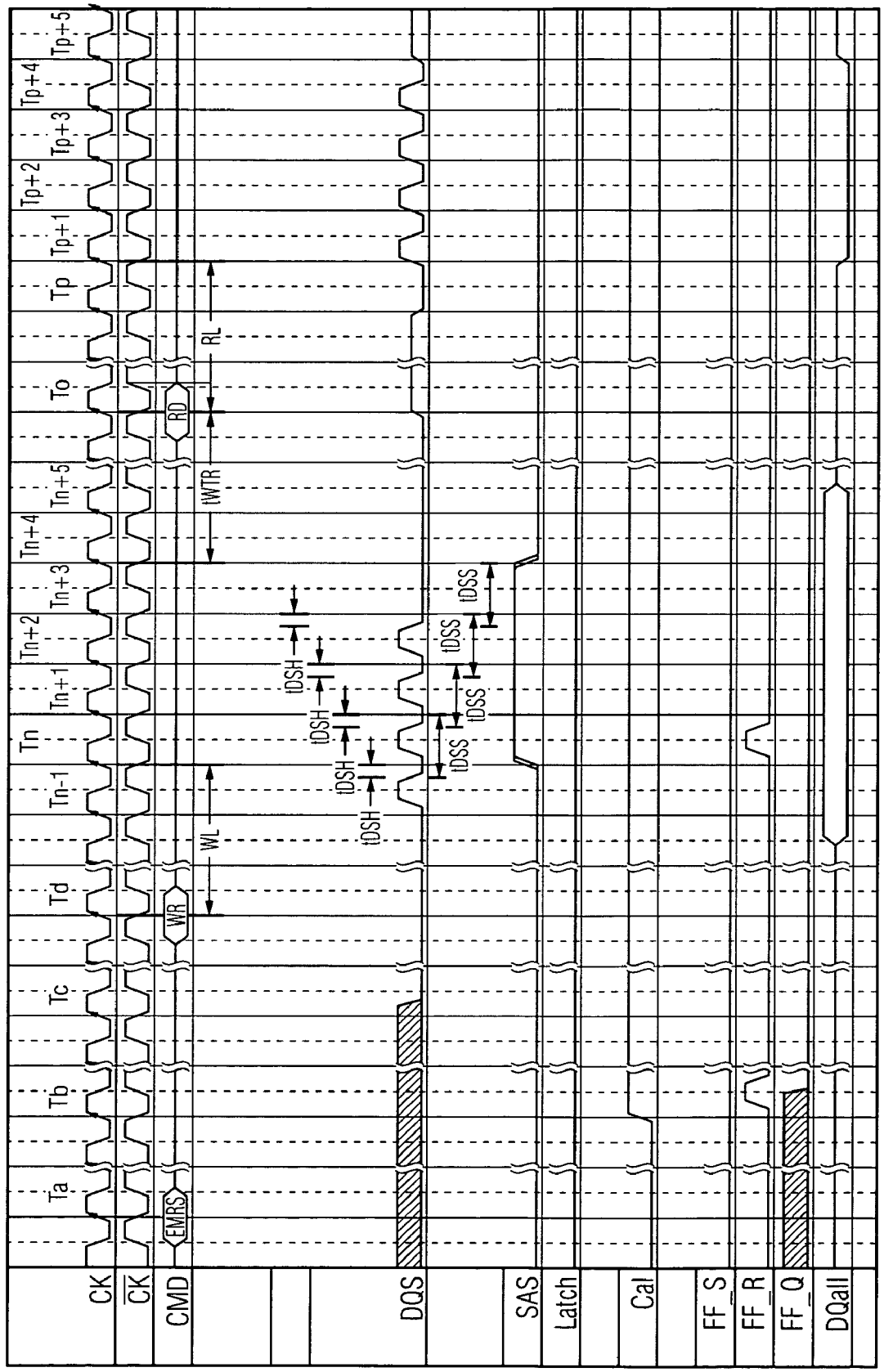
FIG. 7 shows a signal timing diagram if the strobe signal is leading with respect to the clock signals relative to the correct phase relationship.

FIG. 7 shows a case in which the strobe signal DQS is leading with regard to the clock signal CLK, resulting in a contravention of the specification in accordance with the hold time tDSH. The falling edge of the strobe signal DQS lies outside the pulse range defined by the write acceptance signal SAS, so that only three falling edges are counted in the test unit and the SR flip-flop 44 is not set. The "0" which is consequently stored therein shows, then, that an error occurred during the reception of the data and that the phase relation between the clock signal CLK and the strobe signal DQS must be adapted.

Figure 8:
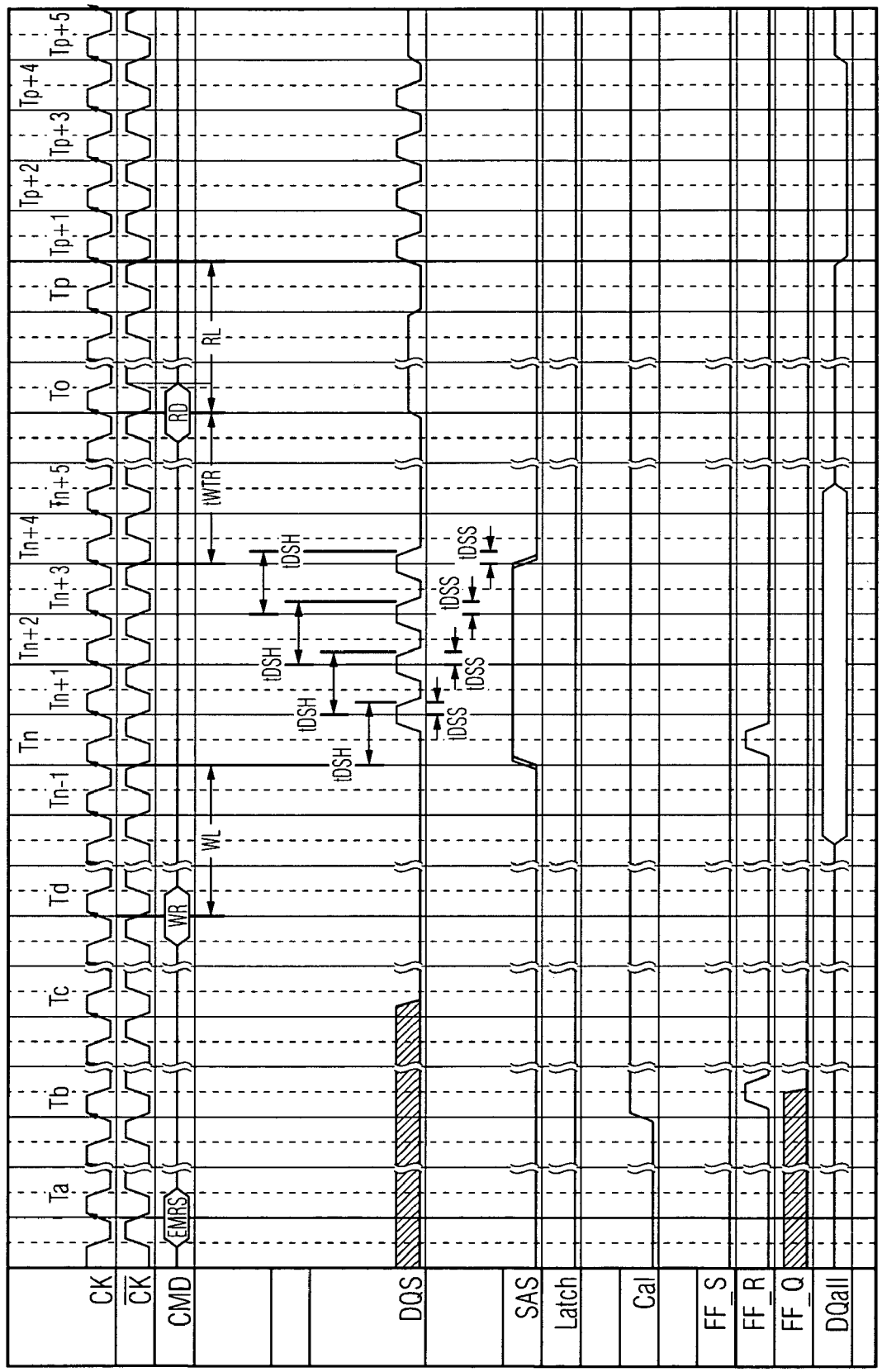
FIG. 8 shows a signal timing diagram, the strobe signal lagging with respect to the clock signal relative to the correct phase relationship.

FIG. 8 illustrates the opposite case, namely where the strobe signal is lagging with regard to the clock signal to such a great extent that the specification is contravened with regard to the setup time tDSS, so that, in the example shown, the last relevant falling edge of the strobe signal is present outside, that is to say after the end of the pulse duration of the write acceptance signal. In this case, too, only three falling edges of the strobe signal are counted and the SR flip-flop 44 is not set. Consequently, an error is detected in this case, too.

When setting the delay between the clock signal CLK and the strobe signal DQS in the memory control unit 20, the procedure may for example be such that firstly the delay is set in such a way that the strobe signal DQS is greatly leading with regard to the clock signal, so that the write data cannot in any event be reliably accepted into the memory circuits 21, 22. A succeeding write operation is carried out and the corresponding error datum is read out. The phase offset between the clock signal and the strobe signal is then increased progressively until an item of error information is obtained which indicates that the data can be accepted reliably into the memory circuit. Afterward, the phase offset is increased further until it is once again ascertained on the basis of the error information that the write data can no longer be reliably accepted. From this it is possible to determine a lower and upper limit of the phase offset between the clock signal and the strobe signal between which it is necessary to set the phase offset for the relevant memory circuit in the memory control unit. The phase offset may be set in such a way that it lies approximately in the middle between the upper and lower limits of the phase offsets. The method described above can also be carried out in the opposite manner, namely in a case where the strobe signal DQS is greatly lagging with regard to the clock signal and the phase offset is progressively decreased in order to ascertain the upper and lower limits of the phase offsets between which the write data can be reliably accepted into the memory circuit.

The read-out of the SR flip-flop 44 can be carried out by setting a special operating mode bit (on which the calibration signal CAL depends) in order to give it a normal read-out command to the RS flip-flop 44. Moreover, it may be further advantageous that during the calibration operating mode, the functionality of the write command is changed in such a way that during the write operation in the calibration operating mode, no data are transferred in to a memory cell array of the memory circuit.

In particular, the calibration mode can be carried out during operation of the memory circuit, so that temperature and other fluctuations of the functions of the memory circuit can be compensated for. This may be carried out in particular when the memory circuit does not have to be addressed because no data are being retrieved from the memory circuit or no data are to be written to the memory circuit.

While the foregoing is directed to embodiments of the present invention, other and further embodiments of the invention may be devised without departing from the basic scope thereof, and the scope thereof is determined by the claims that follow.

What is claimed is:

1. A method for adapting the phase relationship between a clock signal provided by a memory control unit and a strobe signal provided by the memory control unit for accepting write data to be transmitted into a memory circuit, having a write command signal being transmitted to the memory circuit in a manner synchronized with the clock signal, having a write data signal being transmitted synchronously with the strobe signal, having a phase offset between the transmitted clock signal and the transmitted strobe signal being set such that the write data are reliably accepted in the memory circuit, the method comprising the following acts performed in the memory circuit:
generating a write acceptance signal depending on the clock signal and the write command signal with a pulse duration;
determining the number of edges of the strobe signal with a defined edge direction during the pulse duration; and
providing an item of error information depending on the number determined.

2. The method as claimed in claim 1, wherein the number determined is compared with a predetermined desired number of corresponding edges of the strobe signal, and wherein an item of information that specifies whether the number determined matches the desired number is provided as the item of error information.

3. The method as claimed in claim 1, wherein the number determined is provided as the item of error information.

4. The method as claimed in claim 3, wherein the item of error information is buffer-stored in the memory circuit.

5. The method as claimed in claim 4, wherein the item of error information is transmitted to the memory control unit.

6. The method as claimed in claim 5, wherein the memory control unit sets the phase offset depending on the item of error information.

7. The method as claimed in claim 6, wherein the memory control unit selectively sets a calibration operating mode in the memory circuit, and wherein, in the calibration operating mode, the phase offset to be set is determined iteratively by multiple writing of test data.

8. The method as claimed in claim 7, wherein, in the calibration operating mode, the phase offset between the clock signal and the strobe signal is varied in a phase offset range and the corresponding resulting items of error information are received, wherein the resulting corresponding items of error information are utilized to determine an upper limit value and a lower limit value of the phase offsets between which the memory circuit can reliably accept the write data, the phase offset being set between the upper limit value and the lower limit value.

9. The method as claimed in claim 1, wherein the item of error information is derived from an accept signal indicating that all the write data to be received have been received.

10. The method as claimed in claim 9, wherein the item of error information indicates an error when an accept signal is not present after the pulse duration has elapsed.

11. A memory circuit for generating an item of error information for the adaptation of the phase relationship between an applied clock signal and an applied strobe signal, comprising:
 a command data reception unit for receiving a command signal and a clock signal;
 a write data reception unit for receiving a write data signal and a strobe signal; and
 a test unit comprising:
  an edge counter, which determines a number of edges of the strobe signal with a defined edge direction during a pulse duration of a write acceptance signal dependent on the clock signal and the write command signal; and
  a provision unit configured to provide an item of error information depending on the number determined.

12. The memory circuit as claimed in claim 11, further comprising a comparator which compares the number determined with a predetermined desired number of corresponding edges of the strobe signal to generate the item of error information indicating whether the number determined matches the desired number.

13. The memory circuit as claimed in claim 11, wherein the provision unit provides the number determined as the item of error information.

14. The memory circuit as claimed in claim 11, further comprising an output device that outputs the item of error information.

15. The memory circuit as claimed in claim 14, further comprising a buffer storage device that buffer-stores the item of error information for outputting.

16. The memory circuit as claimed in claim 15, wherein the edge counter generates an accept signal that accepts the received write data onto an internal data bus.

17. The memory circuit as claimed in claim 16, wherein the buffer storage device is formed as an RS flip-flop, the RS flip-flop being connected to the edge counter in order to set the RS flip-flop when the accept signal indicates the reception of all the write data to be received, and in order to reset the RS flip-flop at a beginning of the pulse duration of the write acceptance signal.

18. A memory control unit, comprising:
 a command data transmission unit, which transmits a clock signal and a command signal synchronized with the clock signal;
 a write data transmission unit, which transmits a strobe signal and a write data signal synchronized with the strobe signal;
 an error data reception unit that receives an item of error information; and
 a phase circuit having a phase offset between the clock signal and the strobe signal set depending on the received item of error information.

19. The memory control unit as claimed in claim 18, wherein the error data reception unit is configured to receive, an indication indicating whether all of the write data were accepted during a previous write access, as the item of error information.

20. The memory control unit as claimed in claim 18, wherein the error data reception unit receives a number of received edges of the strobe signal as the item of error information, and further comprising a comparator which compares the number of received edges with a desired number to set the phase offset depending on a result of the comparison.

21. The memory control unit as claimed in claim 18, further comprising a control device for setting a calibration mode in a memory circuit that can be connected.

22. The memory control unit as claimed in claim 21, wherein the control device is configured to carry out a plurality of write operations with different phase offsets utilizing the command data transmission unit and the write data transmission unit, wherein the error data reception unit receives a plurality of corresponding items of error information, and wherein the control device is configured to, depending on the items of error information and the different phase offsets, set a phase offset having the associated item of error information which specifies that the write data were able to be accepted into the memory circuit.

23. The memory control unit as claimed in claim 22, wherein the error data reception unit receives the resulting corresponding items of error information, and wherein the control device determines an upper limit value and a lower limit value of the phase offsets between which the memory circuit can reliably accept the write data, the phase circuit setting the phase offset between the upper limit value and the lower limit value.

24. A memory system, comprising:
 a memory circuit for generating an item of error information for the adaptation of the phase relationship between an applied clock signal and an applied strobe signal, comprising:
  a command data reception unit for receiving a command signal and a clock signal;
  a write data reception unit for receiving a write data signal and a strobe signal; and
  a test unit comprising:
   an edge counter, which determines a number of edges of the strobe signal with a defined edge direction during a pulse duration of a write acceptance signal dependent on the clock signal and the write command signal; and
   a provision unit configured to provide an item of error information depending on the number determined; and
 a memory control unit, comprising:
  a command data transmission unit, which transmits a clock signal and a command signal synchronized with the clock signal;
  a write data transmission unit, which transmits a strobe signal and a write data signal synchronized with the strobe signal;
  an error data reception unit that receives an item of error information; and
  a phase circuit having a phase offset between the clock signal and the strobe signal set depending on the received item of error information.

* * * * *